(12) United States Patent
Miller et al.

(10) Patent No.: US 6,741,184 B1
(45) Date of Patent: May 25, 2004

(54) POINTER POSITION DETECTION USING LIGHT EMITTING DIODES

(75) Inventors: Mark J. Miller, Grand Blanc, MI (US); Raymond Lippmann, Howell, MI (US); Ronald K. Selby, Flint, MI (US); Gail M. Sylvester, Frankenmuth, MI (US)

(73) Assignee: Delphi Technologies, Inc., Troy, MI (US)

( * ) Notice: Subject to any disclaimer, the term of this patent is extended or adjusted under 35 U.S.C. 154(b) by 131 days.

(21) Appl. No.: 10/044,536

(22) Filed: Jan. 11, 2002

(51) Int. Cl.[7] .......................... G08B 5/24; G01D 11/28
(52) U.S. Cl. ............... 340/815.78; 340/441; 340/461; 340/815.78; 340/525; 362/23; 362/26; 362/555; 362/559; 116/288; 116/291; 116/297; 250/231.11
(58) Field of Search .................. 340/815.78, 815.79, 340/525, 441, 459–462, 815.45; 362/26, 23, 32, 555, 559; 116/288, 291, 297; 250/231.11

(56) References Cited

U.S. PATENT DOCUMENTS

| | | | | |
|---|---|---|---|---|
| 3,901,605 A | * | 8/1975 | Brainard | 250/231.11 |
| 4,300,548 A | * | 11/1981 | Jones | 116/DIG. 5 |
| 4,609,817 A | * | 9/1986 | Mumzhiu | 250/231.11 |
| 4,631,539 A | * | 12/1986 | Sanders et al. | 340/870.29 |
| 5,121,109 A | * | 6/1992 | Murphy, Jr. et al. | 340/688 |
| 6,356,854 B1 | | 3/2002 | Schubert et al. | 702/150 |
| 6,623,142 B1 | | 9/2003 | Lippmann et al. | 362/293 |

* cited by examiner

Primary Examiner—Donnie L. Crosland
(74) Attorney, Agent, or Firm—Stefan V. Chmielewski

(57) ABSTRACT

An apparatus and method sensing the absolute position of a gauge. A pointer having a predefined rotation with a circular travel pattern. At least one light emitting diode that generates an optical signal. An optical sensor placed in a fixed position along the circular travel pattern of the pointer. A pointer driver for driving the pointer.

47 Claims, 4 Drawing Sheets

POINTER POSITION DETECTION USING LIGHT EMITTING DIODES

TECHNICAL FIELD

The present invention is related to gauge pointers. More specifically, the present invention is related to an apparatus for accurately determining the indicating position of a gauge.

BACKGROUND OF THE INVENTION

In traditional gauge pointer applications, the pointer is driven against a fixed pointer stop upon activation of a system. Using this application, a known position of the pointer can be determined and used for reference when the system is active. A disadvantage of this technique is that an undesirable audible noise is generated when a stepper motor rapidly steps the pointer against the stop.

Other traditional gauge applications do not have a fixed pointer stop. These applications usually have a pointer with a circular rotation of 360 degrees or greater. Driving signals that operate the pointer position may cause an undesirable situation when the position may not be accurately known after a period of time. The cause of this situation may be the result of extreme accelerations, vibration, and drift over time of electronic components. A solution to this problem is the zeroing of the pointer, which is the forcing of mechanical and electrical alignment of the pointer. Traditional zeroing techniques require the use of complex internal optics to detect gear alignment of a pointer motor.

It is the objective of the present invention to overcome these and other fallbacks and complexities in the prior art by providing an apparatus for accurately determining and correcting the indicating position of a pointer.

SUMMARY OF THE INVENTION

The present invention is an apparatus for accurately sensing the absolute position of a gauge. The apparatus includes at least one pointer having a predefined rotation with a circular travel pattern. The apparatus also includes at least one light emitting diode that generates an optical signal. The apparatus also includes at least one optical sensor placed in a fixed position along the circular travel pattern of the pointer. The apparatus also includes a pointer driver that drives the pointer.

The present invention is also directed to a method for detecting and correcting the indicating position of a pointer. The method comprises the steps of generating an optical signal from the light emitting diode, transmitting an optical signal through the pointer hub, sensing an optical signal at the sensor, calculating an error between an actual sensed position of the pointer and a former assumed position of the pointer, zeroing the stepper motor from the calculated error, and transmitting a stepper signal to the pointer driver.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
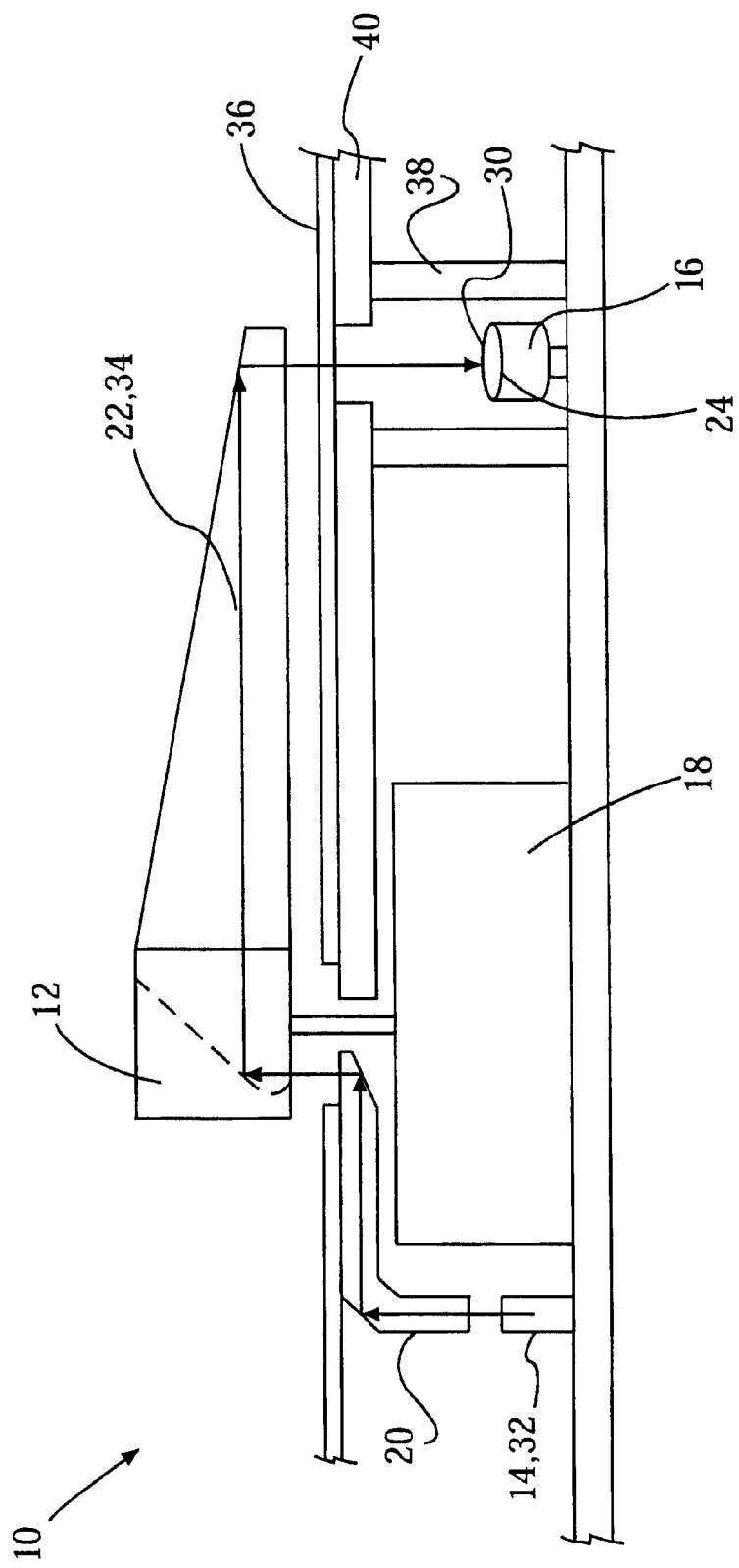
FIG. 1 is a cross-sectional view of a gauge in accordance with the present invention.

As seen in FIG. 1, the present invention is directed to an apparatus for accurately sensing the absolute position of a gauge 10. The gauge 10 includes a pointer 12, a light emitting diode (LED) 14, an optical sensor 16, and a pointer driver 18.

The gauge 10 provides the ability to accurately determine and correct pointer positions and the ability to eliminate pointer positioning noise that is typical with existing pointer zeroing techniques. In order to accurately determine pointer positions and eliminate pointer positioning noise, zeroing, which is the forcing of mechanical and electrical alignment, is required by the pointer driver 18. The zeroing technique of the present invention is achieved by positioning the LED 14 emitting a non-visible light, such as infrared light, near a pointer hub 20.

As seen in FIG. 1, the LED 14 generates a continuous infrared light, which is referred to as a signal 22, that is captured by the pointer hub 20 and directed toward the pointer 12. The pointer hub 20, which may be a lightpipe, has prismatic features to capture, collimate, and reflect the signal 22 to a first end of the pointer 12. The pointer 12, which may also be a lightpipe, reflects the signal 22 down the length of the pointer 12 to its tip. The signal 22 exits the tip of the pointer 12 in a collimated direction toward the optical sensor 16. The optical sensor 16 is placed in a fixed position along the circular travel path of the pointer 12 that has a predefined angular rotation. The predefined angular rotation may be less than, up to, or greater than 360 degrees. The sensor 16 may include an infrared filter 24 to reduce the signal to noise ratio of the signal 22. The filter 24 may also eliminate the effects of a sunlight load and other light noise sources.

Figure 2A:
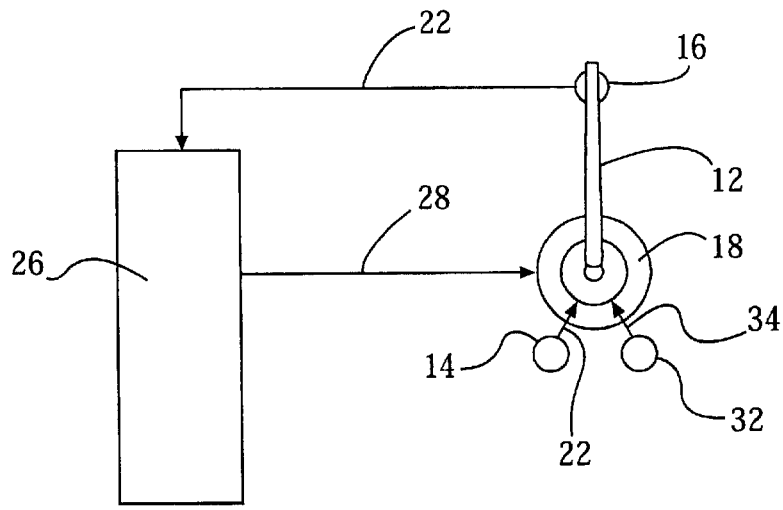
FIG. 2a is a representative view of the gauge in accordance with the present invention.

As shown in FIG. 2a, the signal 22 is detected by the sensor 16 and serves as an input for a microprocessor 26. The microprocessor 26 uses the signal 22 to accurately register the actual position of pointer 12 that is driven by the pointer driver 18. The microprocessor 26 calculates the error between the actual detected position of the pointer 12 and the former assumed position of the pointer 12. The microprocessor 26 then zeroes the pointer driver 18 by transmitting a stepper signal 28 thereto. The pointer driver 18 and stepper signal 28 are hereinafter referred to as the stepper motor 18 and correction signal 28. The correction signal 28 controls the movement of the stepper motor 18 and corrects the actual position of the pointer 12.

To improve the positional accuracy of the pointer 12, the sensor 16 may further include a lens 30. Referring to FIG. 1, the lens 30 focuses the signal 22 emitted from the pointer 12 and yields an improved input for the microprocessor 26. An alternative to improve the positional accuracy of the pointer 12 is by the inclusion of a software algorithm (not shown) within the microprocessor 26. The software algorithm records a positive and negative slope of the signal 22 with the step phase of the stepper motor 18. The software algorithm determines the maximum sensed signal 22 from the sensor 16 through computational techniques for noise reduction and step position corresponding to the maximum continuous signal.

The pointer 12 must also be illuminated for nighttime visibility. As seen in FIGS. 1 and 2a, the pointer 12 is illuminated by positioning a second LED 32 emitting visible light, such as a signal 34, below the pointer 12. The signal 34 propagates through the pointer hub 20 and into the pointer 12. The light emitted by the signal 34 produces an even illumination of the pointer 12 and is cosmetically appealing to the human eye. The gauge 10 may further include a graphics region 36, a graphics region light cavity 38, and a graphics region light pipe 40. The light cavity 38 shields stray or ambient light that may interfere with the sensor 16. The light pipe 40 illuminates the graphic region 36 during nighttime driving.

Figure 2B:
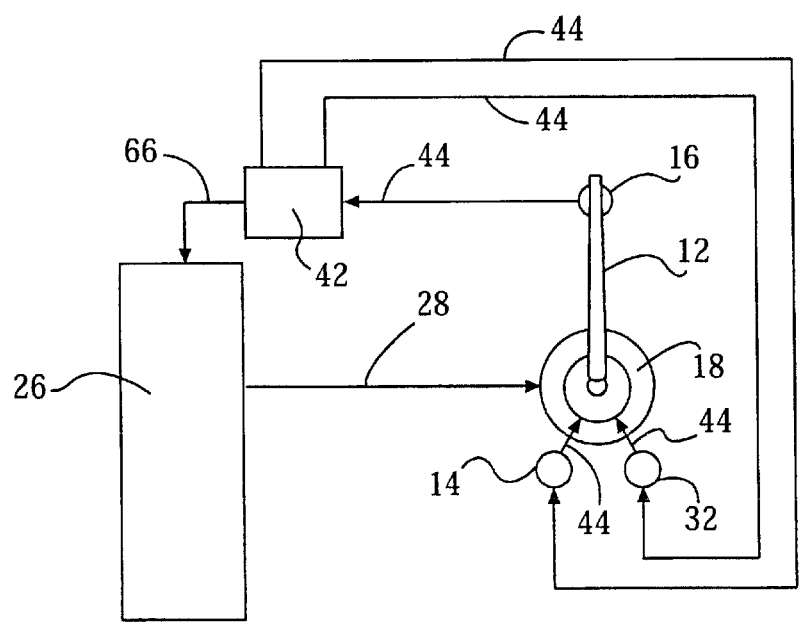
FIG. 2b is a representative view of an alternate embodiment of the gauge in accordance with the present invention.
Figure 3:
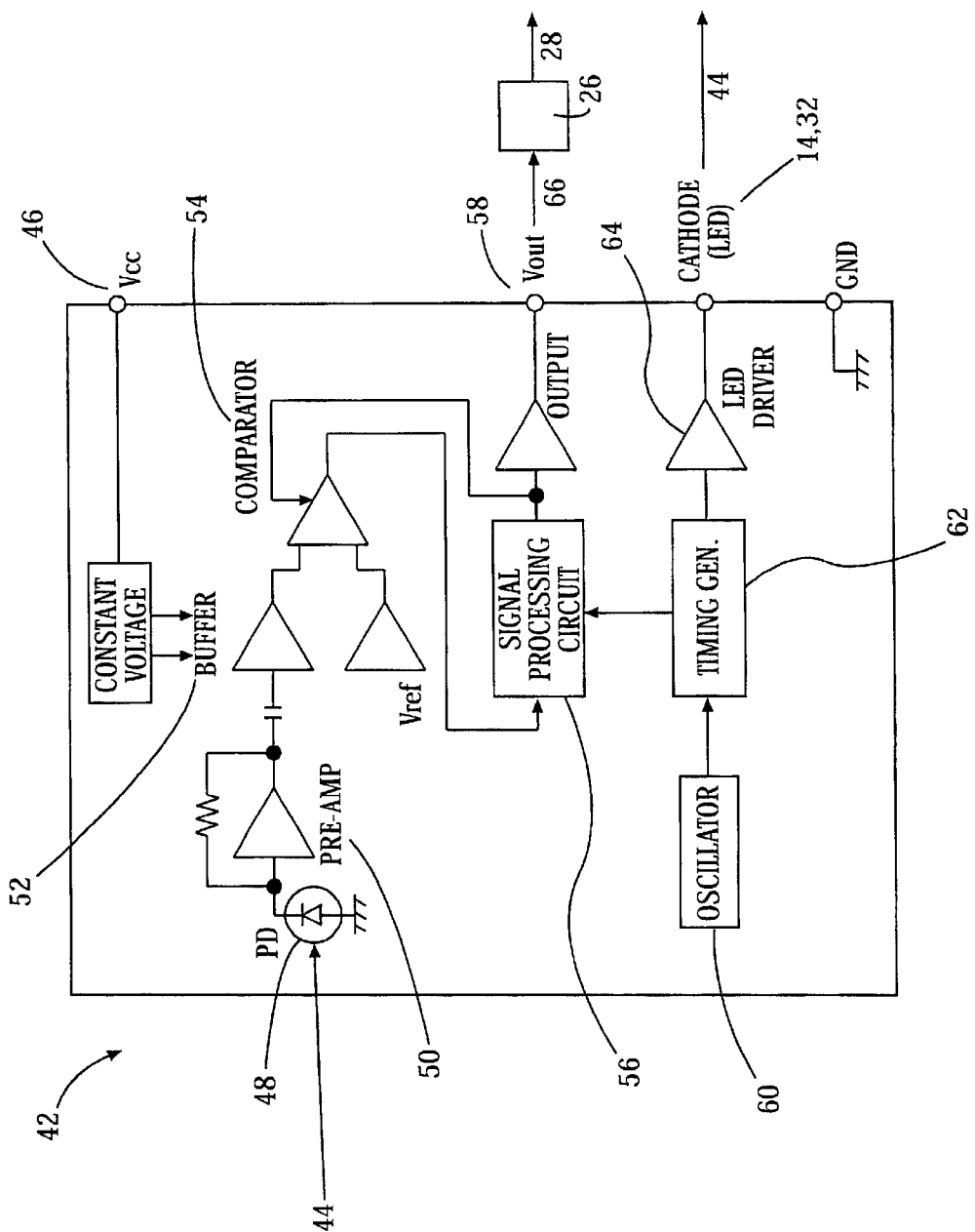
FIG. 3 is a block diagram of a noise rejection circuit in accordance with the present invention.

An alternate embodiment of the gauge 10 may include a signal that is pulsed at a high rate. Narrow pulse widths have much brighter momentary intensities than a continuous signal pulse. A noise rejection circuit 42, as seen in FIGS. 2b and 3, generates and synchronizes a pulsed signal 44. The circuit 42 comprises a voltage source 46, a photodiode 48, a pre-amp circuit 50, a buffer 52, a comparator 54, a signal processing circuit 56, a voltage output 58, an oscillator 60, a timing generator 62, and a LED driver 64.

The oscillator 60, timing generator 62, and LED driver 64 generates the pulsed signal 44 for the infrared LED 14. The unconditioned signal 44 is directed down the length of the pointer 12 and received from the sensor 16 by the photodiode 48. The signal 44 is then conditioned by the buffer 52 and comparator 54. Once the signal 44 has been conditioned, it is then passed to the signal processing circuit 56. The signal processing circuit 56 synchronizes the conditioned signal 44 with the timing generator 62 in order to generate a noiseless microprocessor signal 66. The microprocessor signal 66 is located at the voltage output 58 and serves as the input for the microprocessor 26. The microprocessor 26 reconciles the stepper motor phase position with the actual position of the pointer 12 and drives the stepper motor 18 with the correction signal 28.

Because the LED 14 is pulsed, a higher operating current can be used without damaging the LED 14. The higher current proportionality increases the pulsed signal emission, thereby enhancing the ability of the sensor 16 to detect the pulsed signal 44. As explained above, an infrared filter 24 may be placed over the sensor 16 to improve the signal to noise ratio for a pulsed signal 44. The filter 24 may also eliminate the effects of a sunlight load and other light noise sources.

An alternate embodiment of the gauge 10 may show the visible wavelength LED 32 used singularly or in combination with the infrared LED 14 to emit the pulsed signal 44. In this embodiment, the pointer 12 may have the average illumination level required by lighting demands of the pointer 12 for nighttime visibility. As explained above, a pulsed signal with narrow pulse widths has much brighter momentary intensities. Because the pulsed visible light signal 44 occurs for short intervals in a given time, the average emitted intensity of the visible light over a period of time is undetectable in the pointer 12 by the human eye. The visible LED 32 may be pulsed on or off to provide the appropriate signal level for the input of the microprocessor 26. The filter 24 that primarily passes only the wavelength of the light emitted from the LED 14 may also be implemented in this embodiment in order to also reduce false detection of stray ambient light. This scheme is possible because the visible wavelength LED 32 emits light in very narrow wavelength bands typically +/−4 nanometers either side of the desired dominant wavelength.

Figure 4:
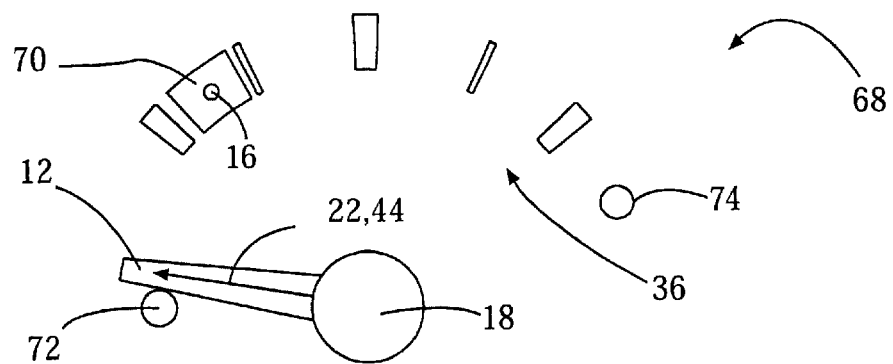
FIG. 4 is a top view of a gauge having a pointer with a circular rotation less than 360 degrees.

The gauge 10 described above in any of the pointer positioning techniques may be used in combination with a warning system 68. As shown in FIG. 4, the graphics region 36 includes a warning zone 70 and a pointer stop 72. The inclusion of the pointer stop 72 shows a gauge that has a circular rotation that is less than 360 degrees. When the pointer 12 enters the warning zone 70, the sensor 16, which is selectively positioned in the warning zone 70, receives the signal 22, 44 from the pointer 12. As described above, the signal 22, 44 is used as an input for the microprocessor 26. When the microprocessor 26 receives the signal 22, 44 that is sensed by the sensor 16, the microprocessor 26 activates an audible or visual alarm 74, which notifies the vehicle occupant of the detected condition. Likewise, when the pointer 12 is detected leaving the warning zone 70, the audible or visual alarm 74 is deactivated.

Figure 5:
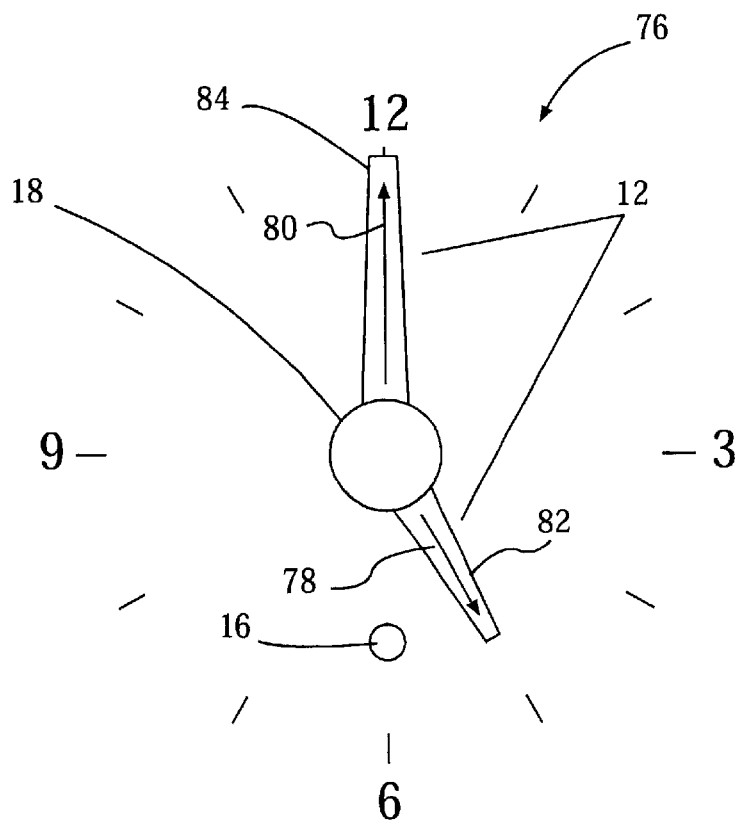
FIG. 5 is a top view of a gauge in accordance with the present invention having two pointers with a circular rotation of 360 degrees.

As shown in FIG. 5, an alternate embodiment of the gauge 10 may show a plurality of pointers 12 such as in gauge 76. The gauge 76 may be a clock or other displays requiring multiple pointers 12. Because the gauge 76 does not include a pointer stop 72 as shown in FIG. 4, the gauge 76 exhibits a circular rotation that is greater than 360 degrees. Although two pointers 12 are shown in this embodiment, a single pointer 12 may be used as well.

Because multiple pointers 12 are employed in the gauge 76, both pointer positions need to be accurately determined. The absolute position of the pointers 12 may be determined with a pair of LEDs and a pair of sensors. The present embodiment shows a pair of LEDs emitting signals 78, 80. The LEDs may be two infrared LEDs, two visible LEDs, or the combination of an infrared LED and a visible LED. One sensor 16 may be used with the pair of LEDs if it is located on the gauge 76 such that the pointers 12 are never overlapping. Conversely, if the pointers 12 overlap in situations when the gauge 76 is a clock, the two signals 78, 80 detected by the sensor 16 may be told apart by the duration of the alignment of the signals 78, 80 or by the time between subsequent transitions of the pointers 12.

In a first case, the hour pointer 82 moves slower than the minute pointer 84. The signal 78 of the hour pointer 82 has a longer duration as long as the width of the hour pointer 82 or emission aperture of its tip is wider than that of the minute pointer 84. In a second case, the time between the signals 78, 80 of the hour 82 and minute pointer 84 occur at intervals that are significantly different. For example, the minute pointer signal 80 is detected by the sensor 16 every hour while the hour pointer signal 78 is detected by the sensor 16 every twelve hours. The microprocessor 26 used in the gauge 76 logs the time between signals 78, 80 and then determines at a later interval what minor corrections are necessary to correct the stepper motor phase position with respect to the position of the pointers 82, 84. Any drift that occurs may be adjusted in the time base due to a crystal time reference when radio based correction data is intermittently available.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. An apparatus for accurately sensing the absolute position of a gauge, comprising:

at least one pointer having a predefined travel pattern;

at least one light emitting diode that generates an optical signal;

at least one optical sensor placed in a fixed position along the travel pattern of the pointer; and a pointer driver for driving the pointer, wherein the at least one light emitting diode further includes a first light emitting diode which emits infrared light and a second light emitting diode which emits visible light.

2. The apparatus according to claim 1, further comprising a pointer hub that captures the optical signal from the first and second light emitting diodes and transmits the optical signal to the pointer.

3. The apparatus according to claim 1, further comprising a microprocessor that receives the optical signal from the optical sensor.

4. The apparatus according to claim 3, wherein the microprocessor further comprises a software algorithm for determining the maximum sensed optical signal.

5. The apparatus according to claim 1, further comprising a circuit for synchronizing and pulsing the optical signal.

6. The apparatus according to claim 5, wherein the circuit further comprises a voltage source, a photodiode, a pre-amp, a buffer, a comparator, a signal processing circuit, a voltage output, an oscillator, a timing generator, and a light emitting diode driver.

7. The apparatus according to claim 1, wherein the predefined rotation of the pointer is greater than 360 degrees.

8. The apparatus according to claim 1, wherein the first light emitting diode emits pulsed infrared light and the second light emitting diode emits constant visible light.

9. The apparatus according to claim 1, wherein the second light emitting diode emits pulsed visible light.

10. The apparatus according to claim 1, wherein the optical sensor further comprises a filter to reduce the sensitivity of ambient light.

11. The apparatus according to claim 1, wherein the optical sensor further comprises a lens applied over the sensor to focus the optical signal emitted from the pointer.

12. The apparatus according to claim 1, further comprising a graphics region.

13. The apparatus according to claim 12, wherein the graphics region further comprises a visual alarm.

14. The apparatus according to claim 1, further comprising an audible alarm.

15. The apparatus according to claim 2, wherein the pointer hub is a lightpipe.

16. The apparatus according to claim 1, wherein the predefined rotation of the pointer is less than 360 degrees.

17. The apparatus according to claim 1, wherein the predefined rotation of the pointer is 360 degrees.

18. An apparatus for accurately determining and correcting the indicating position of a gauge, comprising:

a pointer having a predefined rotation that has a circular travel pattern;

at least one light emitting diode;

an optical signal generated by the at least one light emitting diode;

at least one pointer hub that captures and transmits the optical signal down the length of the pointer;

an optical sensor placed in a fixed position along the circular travel pattern of the pointer;

a filter attached to the optical sensor;

a lens attached to the optical sensor;

a microprocessor that receives the optical signal from the optical sensor;

a circuit for synchronizing and pulsing the optical signal; and a stepper motor for driving the pointer that is controlled by the microprocessor.

19. The apparatus according to claim 18, wherein the microprocessor further comprises a software algorithm for determining the maximum sensed optical signal.

20. The apparatus according to claim 18, wherein the circuit further comprises a voltage source, a photodiode, a pre-amp, a buffer, a comparator, a signal processing circuit, a voltage output, an oscillator, a timing generator, and a light emitting diode driver.

21. The apparatus according to claim 18, wherein said at least one light emitting diode includes first and second light emitting diodes, wherein said first light emitting diode emits a constant infrared light and the second light emitting diode emits a constant visible light.

22. The apparatus according to claim 20, wherein said at least one light emitting diode includes first and second light emitting diodes, wherein said first light emitting diode generates a pulsed infrared light and the second light emitting diode emits a constant visible light.

23. The apparatus according to claim 20, wherein the at least one light emitting diode emits a pulsed visible light.

24. The apparatus according to claim 18, wherein the pointer hub is a lightpipe.

25. The apparatus according to claim 18, further comprising a graphics region.

26. The apparatus according to claim 25, wherein the graphics region further comprises a visual alarm.

27. The apparatus according to claim 18, further comprising an audible alarm.

28. The apparatus according to claim 18, wherein the predefined rotation of the pointer is less than 360 degrees.

29. The apparatus according to claim 18, wherein the predefined rotation of the pointer is 360 degrees.

30. The apparatus according to claim 18, wherein the predefined rotation of the pointer is greater than 360 degrees.

31. An apparatus for accurately determining and correcting the indicating position of a gauge, comprising:

a first pointer having a predefined rotation that has a circular travel pattern;

a second pointer having a predefined rotation that has a circular travel pattern;

at least one light emitting diode;

an optical signal generated by the light emitting diode;

at least one pointer hub that captures and transmits the optical signal down the length of the first and second pointer;

an optical sensor placed in a fixed position along the circular travel pattern of the first and second pointer;

a filter attached to the optical sensor;

a lens attached to the optical sensor;

a microprocessor that receives the optical signal from the optical sensor;

a circuit for synchronizing and pulsing driving the optical signal; and a stepper motor for driving the first and second pointer that is controlled by the microprocessor.

32. The apparatus according to claim 31, wherein the microprocessor further comprises a software algorithm for determining the maximum sensed optical signal.

33. The apparatus according to claim 31, wherein the circuit further comprises a voltage source, a photodiode, a pre-amp, a buffer, a comparator, a signal processing circuit, a voltage output, an oscillator, a timing generator, and a light emitting diode driver.

34. The apparatus according to claim 31, wherein the first light emitting diode emits a constant infrared light and the second light emitting diode emits a constant visible light.

35. The apparatus according to claim 33, wherein the first light emitting diode generates a pulsed infrared light and the second light emitting diode emits a constant visible light.

36. The apparatus according to claim 33, wherein the light emitting diode emits a pulsed visible light.

37. The apparatus according to claim 31, wherein the pointer hub is a lightpipe.

38. The apparatus according to claim 31, further comprising a graphics region.

39. The apparatus according to claim 38, wherein the graphics region further comprises a visual alarm.

40. The apparatus according to claim 31, further comprising an audible alarm.

41. The apparatus according to claim 31, wherein the predefined rotation of the pointer is less than 360 degrees.

42. The apparatus according to claim 31, wherein the predefined rotation of the pointer is 360 degrees.

43. The apparatus according to claim 31, wherein the predefined rotation of the pointer is greater than 360 degrees.

44. A method for sensing the absolute position of a gauge, the gauge having a pointer, at least one light emitting diode, an optical signal, at least one pointer hub, an optical sensor placed in a fixed position along the circular travel pattern of the pointer, a microprocessor that receives the optical signal from the optical sensor, a circuit, and a stepper motor, comprising the steps of:
  generating an optical signal from the light emitting diode;
  transmitting an optical signal through the pointer hub;
  sensing an optical signal at the sensor;
  calculating an error between an actual sensed position of the pointer and a former assumed position of the pointer in the microprocessor;
  zeroing the stepper motor from the calculated error of the microprocessor; and
  transmitting a stepper signal to the stepper motor.

45. The method according to claim 44, wherein the optical signal generating step is performed by the circuit.

46. The method according to claim 45, wherein the optical signal is pulsed.

47. The method according to claim 46, further comprising the step of synchronizing the sensed optical signal with the generated optical signal.

\* \* \* \* \*